United States Patent
Ruusuvuori

(10) Patent No.: US 6,270,281 B1
(45) Date of Patent: Aug. 7, 2001

(54) MOUNTING METHOD AND DEVICE FOR MOUNTING RAILS

(76) Inventor: Tommi Ensio Ruusuvuori, Rieskalähteentie 33, FIN-20320 Turku (FI)

( * ) Notice: Subject to any disclaimer, the term of this patent is extended or adjusted under 35 U.S.C. 154(b) by 0 days.

(21) Appl. No.: 09/155,566

(22) PCT Filed: Feb. 2, 1998

(86) PCT No.: PCT/FI98/00097

§ 371 Date: Sep. 30, 1998

§ 102(e) Date: Sep. 30, 1998

(87) PCT Pub. No.: WO98/36627

PCT Pub. Date: Aug. 20, 1998

(30) Foreign Application Priority Data

Feb. 3, 1997 (FI) .......................................... 970441
Aug. 19, 1997 (FI) .......................................... 973385

(51) Int. Cl.[7] ...................................................... F16B 5/02
(52) U.S. Cl. ...................... 403/11; 403/408.1; 312/334.4; 411/112; 411/85; 211/182
(58) Field of Search .................................. 403/408.1, 21, 403/22, 11, 12, 13, 14; 29/700; 312/334.4, 334.5, 265.1, 265.4; 411/111, 112, 113, 84, 85; 211/182, 189

(56) References Cited

U.S. PATENT DOCUMENTS

| | | | | |
|---|---|---|---|---|
| 2,495,037 | * | 1/1950 | Tinnerman | 411/112 |
| 2,649,126 | * | 8/1953 | Tinnerman | 411/113 |
| 3,195,735 | * | 7/1965 | Jay | 211/182 X |
| 3,358,848 | * | 12/1967 | Johnsson | 211/182 X |
| 3,871,525 | * | 3/1975 | Al-Dabbagh et al. | 211/182 X |
| 4,135,837 | * | 1/1979 | Suttles | 211/189 X |
| 4,270,591 | * | 6/1981 | Gill et al. | 411/112 |
| 4,488,844 | * | 12/1984 | Baubles | 411/85 |
| 4,541,344 | * | 9/1985 | Nichol | 211/182 X |
| 4,643,319 | | 2/1987 | Debus et al. | 211/189 |
| 4,896,992 | * | 1/1990 | Muhlethaler | 211/182 X |
| 4,967,916 | * | 11/1990 | Handler et al. | 211/182 X |
| 4,988,008 | * | 1/1991 | Blum et al. | 211/182 X |
| 5,209,356 | | 5/1993 | Chaffee | 211/26 |
| 5,791,498 | * | 8/1998 | Mills | 211/26 |
| 5,807,008 | * | 9/1998 | Schwenk et al. | 312/265.1 X |

FOREIGN PATENT DOCUMENTS 4 233 205 C1   3/1994   (DE) .
4 233 402 A1   4/1994   (DE) .
0 237 388 BI   9/1987   (EP) .

* cited by examiner

Primary Examiner—Harry C. Kim
(74) Attorney, Agent, or Firm—James C. Lydon

(57) ABSTRACT

Two alternative mounting methods and devices for mounting rails achieve new points of mounting (8) by adding new pitch-holes to mounting rails (2) and using either adjustable cage-nuts or cage-nuts containing two nuts in their respective pitch-holes. The shape of the new pitch-holes preserves the structural integrity of mounting rails (2). The number of mounting points and possibilities can be dramatically increased, thereby satisfying various ventilation and pass-through requirements between devices (5).

10 Claims, 2 Drawing Sheets

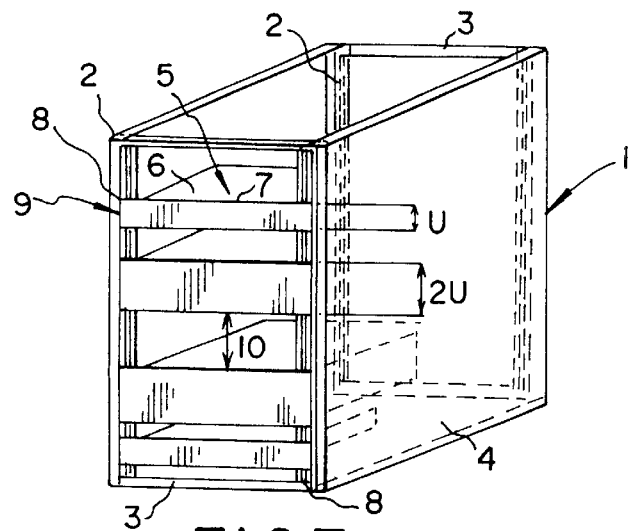
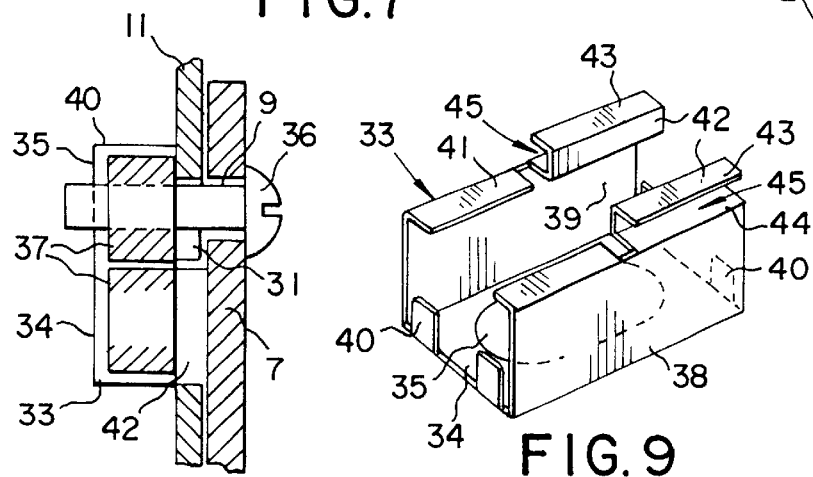
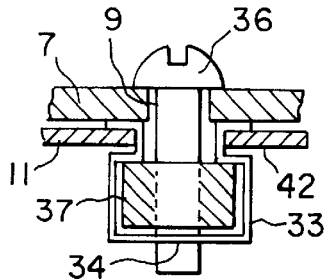
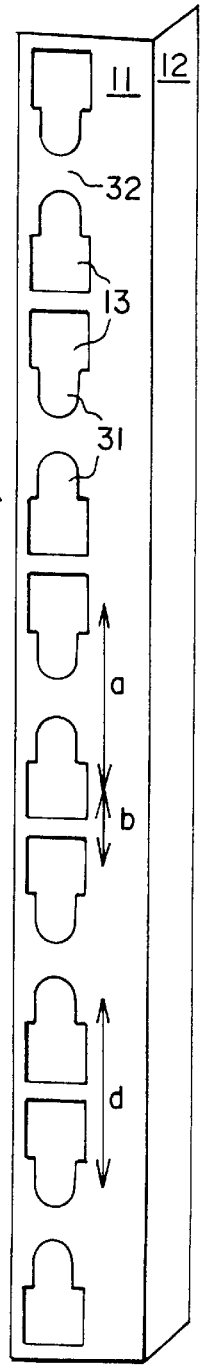

MOUNTING METHOD AND DEVICE FOR MOUNTING RAILS

BACKGROUND OF THE INVENTION

This invention comprises two alternate mounting methods and devices to secure a variety of measuring, musical, telecommunications, audio, videorecording and similar devices to mounting rails equipped with square pitch-holes in either standardised or otherwise regular attachment. Typically mounting devices comprise bolts securing the front plates of sub-racks to cage nuts installed in the square-pitch holes in the mounting rails. As a result of standardised or regular pitch-hole arrangement mounting locations are limited. Alternate mounting methods and devices described here will increase the amount of mounting locations.

The use of mounting rails has arisen from the need to combine together different self-contained pieces of equipment by housing them in sub-rack cases. Mounting rails have then been used to build cabinets, to which pieces of equipment have been installed by securing them from their front plates to the mounting rails. Cover-plates and parts needed for structural integrity of the cabinet have typically also been secured to the mounting rails. Early mounting rails were typified by holes equipped with grooves drilled to solid metal rails, but they gave way to solutions like the cage-nut, allowing bigger tolerances of measure, choice of grooves to be used and easier maintenance in case of breakage.

There are also known from the past mounting methods based on receptacles for mounting bolts that move freely along the total length of the mounting rail. System such as this allows securing of sub-racks to any height chosen in the mounting rail. However, securing receptacles that are allowed to move freely vertically are unreliable with heavy loads, as securing is based on friction or similar arrangement. Horizontal straightness of sub-racks to be mounted is not easy to achieve and their distances from each other doesn't remain constant as new sub-racks are added in the course of time. Freely adjustable mounting has usually been used only in lightweight assemblies or in panel- or sub-assemblies within sub-racks themselves. The profile structure used in freely adjustable mounting rails makes it an expensive solution.

Mounting rails with fixed pitch-holes arranged according to standard also pose problems. Due to standards widely used by rack-cabinet manufacturers the mounting-holes of equipment front plates correspond to the size of the equipment unit U (U=unit). Fixed in width, the size of equipment varies in height, expressed in sequence of U's as in 1U, 2U, 3U, etc. Exact directives regulating rack-rail pitch-hole and front plate mounting hole arrangement can be found in standards. Most common arrangement can be found for example in IEC standard 297.

Due to the combined effects of this system of mounting and standardisation the space needed for cable pass-throughs and ventilation between the sub-racked pieces of equipment always requires at least 1U of empty space to be left. Leaving an in-between space of at least 1U is also required when mounting pieces of equipment that don't conform to standard heights, or devices that have standing-feet for free-standing operation. The required amount of space to be left empty in a rack-cabinet varies according to specific needs of different groups of end-users.

Practice has shown, that due to standardisation, in extreme cases only every second 1U space available in a mounting rail can be used. This is specifically true when four-point mounting (securing the device from all of it's front plate's four corners) is used. Securing the device only from its two lowest front plate mounting-holes allows it to be secured to mounting rail pitch-holes intended to secure front plates upper portion, but because of the nature of pitch-hole sequence this approach is only valid for one particular piece of equipment, as the next device immediately above would have to be secured only from its uppermost front plate mounting-holes. This would result in a highly unstable mounting. No significant advantage or variation can be gained by applying two-point mounting to an EIC regulated mounting rail in an effort to reduce the size of empty space between devices. Two-point mounting adds stress to mounting structures and is totally unacceptable in mobile installations.

To add variation to the mounting possibilities allowed by IEC standard, an additional pitch-hole of fixed type has sometime been added exactly in the middle of each space designed to receive 1U in the mounting rail. Using this additional pitch-hole it is possible to randomly create smaller gaps between units to be mounted, but all but 3U high devices and certain specially formatted devices can only be two-point mounted in this position. As such, these pitch-holes do not constitute a significant improvement to the standardised arrangement.

BRIEF SUMMARY OF THE INVENTION

The invention described here adds flexibility to mounting procedures of rack-devices by allowing four-point mounting of any device equipped with EIC 297 defined mounting-holes using any pitch-hole, including the new additional pitch-hole described here, as a starting point for mounting. Additional mounting possibilities allow creation of smaller gaps when space for ventilation, cable pass-through or such is needed between devices. Devices can also be mounted adjacent to each other even when starting the mounting from the new mounting-point. The biggest advantage of the solutions described here is total compatibility with the most widely used present standards and devices conforming to them. The invention's implementation would be cost-effective and requires only minor changes to already existing production. Mounting rails have to be equipped with new pitch-holes, but at the same time the original mode of mounting can be maintained by using ordinary mounting-devices. Vice-versa, the new mounting devices can be used in unmodified mounting rails. The cost of production of this invention does not differ significantly from present solutions, and the tooling costs needed to start the production are fairly small.

BRIEF DESCRIPTION OF THE DRAWINGS

FIG. 7 shows the principle by which devices are mounted to mounting rails equipped with additional groove-like stationary pitch-holes.

FIG. 8 shows one possible mode of execution of a mounting rail equipped with additional groove-like stationary pitch-holes.

FIG. 9 shows the cage designed to contain two nuts without the nuts enclosed.

FIG. 10 shows the cage designed to contain two nuts with the nuts enclosed.

FIG. 11 shows a vertical cut-away view of the new stationary mounting-point.

FIG. 12 shows a horizontal cut-away view of the new stationary mounting point.

DETAILED DESCRIPTION OF THE PREFERRED EMBODIMENTS

Figure 1:
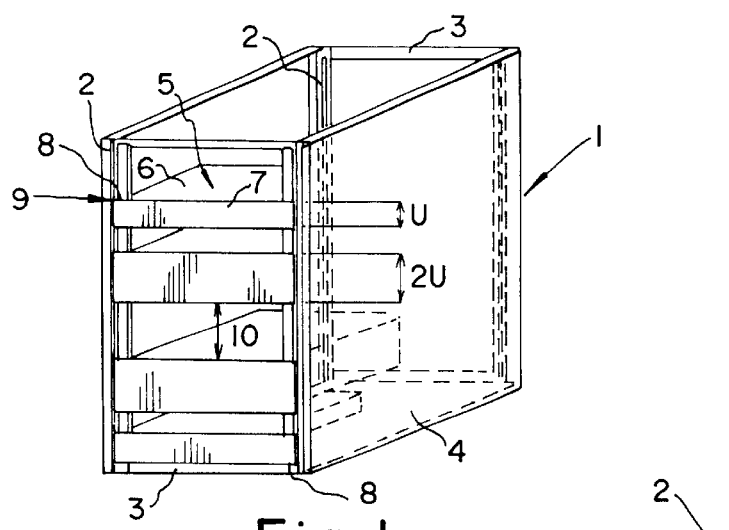
FIG. 1 shows the principle by which devices are mounted to mounting rails equipped with additional adjustment-enabling pitch-holes.
Figures 3, 5:
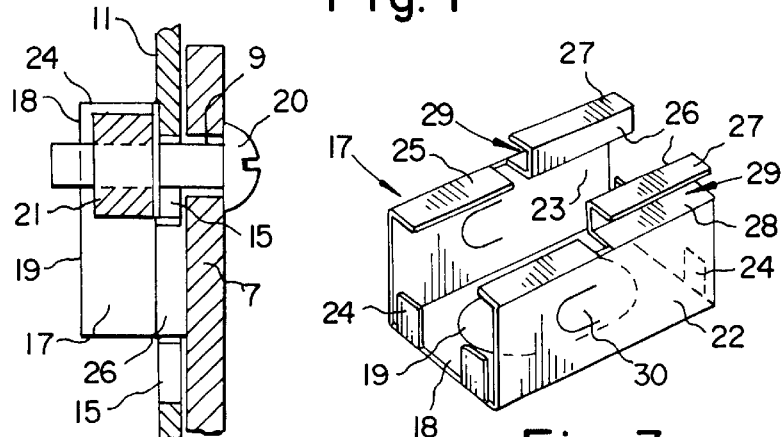
FIG. 3 shows the adjustment-enabling cage without the nut enclosed.
FIG. 5 shows a vertical cut-away view of the adjustable mounting-point.
Figures 4, 6:
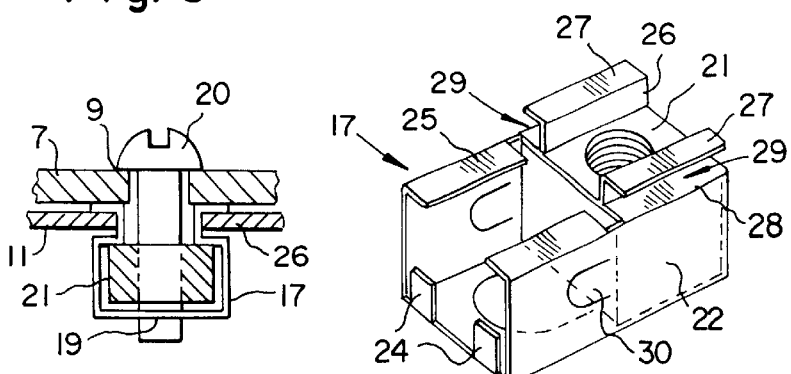
FIG. 4 shows the adjustment-enabling cage with an adjustable nut enclosed.
FIG. 6 shows a horizontal cut-away view of the adjustable mounting-point.

The characterizing qualities of this invention include additional square pitch-holes with a groove or grooves running from their sides lengthwise to the mounting rail which are made between the usual pitch-holes. Mounting bolts penetrating through the new pitch-holes can be adjusted lengthwise to the mounting rail to reach new points of mounting necessitated by the fixed-point standard pitch-holes. During adjustment mounting-bolts passing through new pitch-holes move as a unit with their receiving nuts lengthwise to the mounting rail. In this mounting method at least two mounting-holes of a device's front plate will be secured to standard pitch-holes, into which it is possible to assemble either a non-adjustable or an adjustable but immobilized cage-nut. This mounting method allows the use of both adjustable and nonadjustable mounting devices together, or the use of adjustable mounting devices alone. Devices to be four-point mounted vary in size by unit size U. Adjustment-enabling cage also allows the nut inside to be locked immovable with the aid of locking devices such as ledges or screws located in the sides of the cage. Mounting wings attaching the adjustable cage-nut to it's pitch-hole are located at either end, or in the middle of the cage. At both ends of the cage reside flanges, or their equivalent, preventing the nut from falling out of the cage enclosing it. Mounting-wings and separate flanges on the top of the cage close the nut inside from the top. The cage is manufactured from a single piece of metal or a suitable alternative.

Alternatively the square pitch-holes of an ordinary mounting rail are equipped with additional grooves running longitudinally to the mounting rail, thus forming new, mounting-screw receiving pitch-holes. At each mounting location defined for 1U these grooves run from the lower pitch-hole's upper side and upper pitch-hole's lower side towards the center of the aforementioned 1U mounting location. The new mounting device, a cage-nut containing two nuts, is fastened by its mounting-wings to the square pitch-hole in such a manner that the nut residing beneath the mounting-wings is located under the old pitch-hole, and the second nut at the other end of the cage is situated under the additional groove forming the new pitch-hole. A groove at the bottom of the cage-nut allows pass-through of the fastening screws. The mounting-wings attaching the cage-nut to it's pitch-hole are located at the extreme end of the cage containing the two nuts. At both ends of the cage reside flanges, or their equivalent, preventing the nut from falling out of the cage enclosing it. Mounting-wings and separate flanges on the top of the cage close the nuts inside from the top. The cage is manufactured from a single piece of metal or a suitable alternative.

Considerable benefits are gained by the use of either mounting method and device as described here. Space-efficiency of mounting can be increased as it is no longer necessary to leave a minimum of 1U empty space, if empty space between devices is called for. The mounting methods and devices described here are economic and simple solutions to practical problems inherent in partly aged standard environment. The invention described here works flawlessly in the present standardised environment, such as that represented by IEC 297. Rack-installations demanding cable pass-throughs and ventilation can now be executed more efficiently and increased possibilities of four-point mounting increase structural strength and reduce the possibility of damage.

Referring to the drawings, FIG. 1 shows one possible use of a mounting rail as a part of a cabinet structure. Cabinet space frame 1 comprises mounting rails 2 acting as cornerposts. In this case, they are defined as L-profile rails. Supportive struts 3 have been fixed to mounting rails 2. Plates can be used as walls and ceiling to shield the cabinet. Devices 5 are mounted with their casings 6 towards the inside of cabinet 1. The front plates 7 of the devices 5 are secured to mounting rails 2 through holes 9. Unitsize U shows the height of device 5. Arrow 10 indicates the empty space between devices 5.

Figure 2:
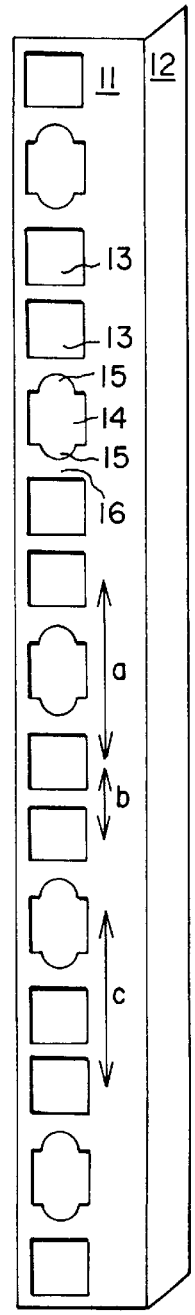
FIG. 2 shows one possible mode of execution of a mounting rail equipped with additional adjustment-enabling pitch-holes.

In FIG. 2 the mounting rail 2 is shown in enlarged form. The flanges of L-profile are marked by numbers 11 and 12. The old square pitch-holes 13 conforming to standard are located lengthwise to the mounting rail 2 in such a manner, that distance a is equivalent to the distance of holes in a 1U front plate 7 and distance b is equal to the shortest distance between mounting points 8. The new pitch-hole 14 is located in the middle of distance a. Grooves 15 are located to the sides of pitch-hole 14 lengthwise to mounting rail 2, thereby enabling sufficient adjustability without compromising the structural strength of mounting rail 2 and ledge 16.

In FIGS. 3–6 the respective structures of an adjustment-enabling mounting device and a mounting-point are shown. The adjustable cage 17 to be used in new pitch-holes 14 is made by folding it from single piece of metal or by other means convenient. The bottom 18 contains a groove 19, through which screw 20 of any length can move while being adjusted to a suitable position. The nut 21 is enclosed between sidewalls 22 and 23. On both ends of adjustment-enabling cage 17 lie flanges 24, which prevent nut 21 from falling out from the cage 17. Flanges 25 located on the top of sidewalls 22 and 23 and mounting-wings 26 close the nut 21 from above within cage 17. On the other end of cage 17 lie mounting-wings 26 with it's sides 27 and 28 forming a groove 29 wide enough to attach to flange 11 of mounting rail 2. Cage 17 is installed to pitch-hole 13 or 14 by pressing the cage in such a manner, that flange 11 is pressed into grooves 29. While tightening bolt 20 nut 21 presses the lower part 28 of mounting-wing 26 and flanges 25 against flange 11. The upper parts 27 of mounting-wings 26 are pressed between flange 11 and the front plate 7 of device 5. Because the pitch-holes 13 and 14 in mounting rail 2 lie fairly close to each other it is convenient to locate mounting-wings 26 at the far end of cage 1. Thus, when pitch-holes 13 and 14 are close to each other, space can be saved by changing the mounting direction of cage 17. The nut 21 can be locked immoveable with ledges 30 located in sidewalls 22 and 23.

FIG. 7 shows again one possible use of a mounting rail as a part of cabinet structure. Cabinet space-frame 1 comprises mounting rails 2 acting as cornerposts. In this case, they are defined as L-profile rails. Supportive struts 3 have been fixed to mounting rails 2. Plates can be used as walls and ceiling to shield the cabinet. Devices 5 are mounted with their casings 6 towards the inside of cabinet 1. The front plates 7 of the devices 5 are secured to mounting-points 8 in mounting rails 2 through holes 9. Unitsize U shows height of device 5. Arrow 10 indicates the empty space between devices 5.

FIG. 8 shows the mounting rail 2 in enlarged form. The flanges of L-profile are marked by numbers 11 and 12. The old square pitch-holes 13 conforming to standard are located lengthwise to the mounting rail 2 in such a manner, that distance a is equivalent to the vertical distance of holes in a 1U front plate 7 and distance b is equal to the shortest distance between mounting-points 8. Distance d is also equivalent to the vertical distance of holes in a 1U front plate 7 and it also shows the new positioning of devices 5 made possible by new pitch-holes 31. The new pitch-holes 31 run groove-like from old pitch-holes 13 towards the center of space reserved for 1U. Groove-like in shape, they allow for new mounting-points 31 without weakening mounting rail 2 and ledge 32.

FIGS. 9–12 show the respective structures of the new nonadjustable pitch-hole and mounting device. Cage-nut 33 functions as a securing-device in the combination of pitch-holes 13 and 31 and it's made by folding it's cage from a single sheet of metal or other suitable material. At the bottom of the cage 33 lies a groove 35 allowing screws 36 of any length to pass through the cage 33. Nuts 37 are contained between sidewalls 38 and 39. At both ends of cage 33 lie flanges 40 to prevent nuts 37 from escaping. Flanges 41 and 42 situated on top of sidewalls 39 and 39 and mounting-wings 42 enclose nuts 37 within cage 33 from above. Mounting-wings 42 are situated on the other end of cage 33 forming a groove wide enough to receive flange 11 of the mounting rail 2. To mount cage-nut 33 to it's pitch-hole 13 the cage 33 is pressed in such a manner that flange 11 is pressed to grooves 45. As screw 36 located in pitch-hole 13 is tightened the nut 37 presses lower portions 44 of mounting-wings 42 and flanges 41 against flange 11. The upper portions 43 of mounting-wings 42 are pressed between flange 11 and the front plate 7 of device 5. When tightening screw 36 located in pitch-hole 31 the nut 37 presses the flanges 41 against flange 11 while front plate 7 of device 5 is pressed against the other side of flange 11.

The adjustment-enabling mounting method and device described in FIGS. 1–6 works in a following manner. Additional pitch-holes 14 are added to IEC 297 regulated mounting rails 2. Adjustment-enabling cage-nuts 17 are then installed in these pitch-holes 14. To fully cover the range of adjustment allowed by pitch-hole 14, cage-nut 17 should be turned into direction of either groove 15. In practice it is easiest to secure front plates 7 to standard pitch-holes 13 as they comprise a fixed mounting-point 8 when using old-fashioned cage-nuts. If adjustment-enabling cage-nuts are to be used in standard pitch-holes 13 it would be advisable to immobilize nut 17 using ledges 30 to ease assembling. It would be practical to start securing of front plates 7 of devices 5 from adjustable mounting-points 8 and adjust the device to reach fixed mounting-points 8.

The alternate non-adjustable mounting method and device described in FIGS. 7–12 works in a following manner. New, groove-like pitch-holes 31 are added to standard mounting rails 2. Cage-nuts 33 containing two nuts 37 are mounted to pitch-holes comprising a combination of pitch-hole 13 and pitch-hole 31 in such a manner that nut 37 under mounting-wings 42 is positioned to correspond with pitch-hole 13 and the other nut 37 corresponds with pitch-hole 31. Mounting of devices 5 can now take place either to original pitch-holes 13 or with a half a U deviation to pitch-holes 31.

It is obvious to a professional that different modes of execution can be applied to both alternate methods and devices. In the solution described in FIGS. 1–6 the square nut 21 could be substituted with a standard hexagonal nut or similar equivalent. The mounting-wings 26 of cage 17 can reside anywhere on its longitudinal axis, provided that this is reflected in the form of the new pitch-hole 14. Locking devices 30 can take any form deemed efficient, including solutions based on friction, etc. In the alternate solution described by FIGS. 7–12 the new pitch-hole 31 could be executed as a plain round hole. The combined shape of pitch-holes 13 and 31 could also be totally re-designed if compatibility with the standard system is not needed.

What is claimed is:

1. A mounting device suitable for securing measuring, musical, telecommunications, audio and videorecording devices to mounting rails, comprising
    at least one mounting rail having a plurality of non-adjustable pitch-holes in a standard arrangement and at least one adjustable pitch-hole containing at least one longitudinal groove;
    at least one bolt having an end portion capable of passing through said adjustable pitch-hole and a corresponding hole in a front plate of a device to be mounted on said mounting rail; and
    at least one adjustment-enabling cage-nut comprising a nut capable of being tightened on an end of said end portion of said bolt, said nut enclosed within a cage which has an opening corresponding to the longitudinal groove of said adjustable pitch-hole to permit passage of said end portion of said bolt, such that said bolt and nut can move in cooperating relationship along the longitudinal groove and opening, respectively.

2. The mounting device of claim 1, wherein said nonadjustable pitch-holes have a square hole opening.

3. A mounting device suitable for four-point mounting of measuring, musical, telecommunications, audio and video-recording devices of standard size or non-standard size to mounting rails, comprising
    at least two mounting rails, each having a plurality of non-adjustable pitch-holes in a standard arrangement and at least one adjustable pitch-hole, said adjustable pitch-hole containing at least one longitudinal groove;
    at least four bolts, each having an end portion capable of passing through said pitch-holes and a corresponding hole in a front plate of a standard-sized device to be mounted on said mounting rails;
    at least four cage-nuts, each comprising at least two nuts capable of being tightened on an end of said end portion of said bolts, said nuts immobilized in side-by-side relationship within a cage which has an opening to permit passage of said end portion of said bolt.

4. A method for mounting measuring, musical, telecommunications, audio and videorecording devices to mounting rails, comprising
    providing at least one mounting rail having a plurality of non-adjustable pitch-holes in a standard arrangement and at least one adjustable pitch-hole containing at least one longitudinal groove;
    providing at least one bolt having an end portion capable of passing through said adjustable pitch-hole and a corresponding hole in a front plate of a device to be mounted on said mounting rail;
    providing at least one adjustment-enabling cage-nut comprising a nut capable of being tightened on an end of said end portion of said bolt, said nut enclosed within a cage which has an opening corresponding to the longitudinal groove of said adjustable pitch-hole to permit passage of said end portion of said bolt, such that said bolt and nut can move in cooperating relationship along the longitudinal groove and opening, respectively; and securing said device to said mounting rail at a mounting point by aligning a hole of said front plate with said adjustable pitch-hole, passing said bolt through said adjustable pitch-hole and the front plate hole, and tightening said adjustment-enabling cage-nut on said bolt, wherein said front plate contains at least four mounting holes.

5. The method of claim 4, wherein said non-adjustable pitch-holes have a square hole opening.

6. The method of claim 4, wherein said front plate of said device is secured at four mounting points, two on said mounting rail and another two mounting points on a second mounting rail, wherein at least one of said mounting points uses a non-adjustable pitch-hole.

7. The method of claim 4, wherein said device has a unit size.

8. The method of claim 4, further comprising securing said device to said mounting rail at a second mounting point on said mounting rail by aligning another hole of said front plate with another pitch-hole, passing another bolt through said another pitch-hole and said another front plate hole, and tightening either another adjustment-enabling cage-nut or a non-adjustable cage-nut on said bolt another bolt, said non-adjustable cage nut comprising a nut immobilized within a cage which has an opening corresponding to the non-adjustable pitch-hole to permit passage of said end portion of said bolt.

9. A method for four-point mounting of measuring, musical, telecommunications, audio and videorecording devices of standard size or non-standard size to mounting rails, comprising providing at least two mounting rails, each having a plurality of non-adjustable pitch-holes in a standard arrangement and at least one adjustable pitch-hole, said adjustable pitch-hole containing at least one longitudinal groove;

providing at least four bolts, each having an end portion capable of passing through said pitch-holes and a corresponding hole in a front plate of a standard-sized device or a non-standard-sized device to be mounted on said mounting rails;

providing at least four cage-nuts, each cage-nut comprising at least two nuts capable of being tightened on an end of said end portions of said bolts, said nuts immobilized in side-by-side relationship within a cage which has an opening to permit passage of the end portion of one of said bolts; and either securing said standard-sized device to said mounting rails at four mounting points by aligning a hole of said front plate with either an adjustable or a non-adjustable pitch-hole, passing said bolt through said non-adjustable pitch-hole and the aligned front plate hole, and tightening one of said nuts on said bolt at each such mounting point, or securing said non-standard-sized device to said mounting rails at four mounting points by aligning a hole of said front plate with a combination of adjustable and non-adjustable pitch-holes, passing bolts through said adjustable and non-adjustable pitch-holes and the aligned front plate holes, and tightening one of said nuts on said bolt at each mounting point.

10. The method of claim 9, wherein at least one of said cage-nuts is positioned such that one of its nuts is aligned with a first hole of said mounting rail and the second nut is aligned with a second hole of said mounting rail adjacent said first hole.

* * * * *